United States Patent
Bar et al.

(10) Patent No.: US 8,975,737 B2
(45) Date of Patent: Mar. 10, 2015

(54) TRANSMISSION LINE FOR ELECTRONIC CIRCUITS

(75) Inventors: Pierre Bar, Grenoble (FR); Sylvain Joblot, Bizonnes (FR); Jean-François Carpentier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 598 days.

(21) Appl. No.: 13/279,138

(22) Filed: Oct. 21, 2011

(65) Prior Publication Data

US 2012/0106120 A1 May 3, 2012

(30) Foreign Application Priority Data

Oct. 27, 2010 (FR) ..................................... 10 58826

(51) Int. Cl.
| | | |
|---|---|---|
| H01L 23/02 | (2006.01) | |
| H01P 3/08 | (2006.01) | |
| H01L 23/66 | (2006.01) | |
| H01L 25/065 | (2006.01) | |
| H01P 5/02 | (2006.01) | |
| H01L 27/00 | (2006.01) | |

(52) U.S. Cl.
CPC ............... *H01P 3/082* (2013.01); *H01L 23/66* (2013.01); *H01L 25/0657* (2013.01); *H01P 5/028* (2013.01); *H01L 2223/6627* (2013.01); *H01L 2225/06513* (2013.01); *H01L 2225/06527* (2013.01); *H01L 2924/0002* (2013.01)
USPC .......................................... 257/686; 257/777

(58) Field of Classification Search
CPC ................................ H01L 23/02; H01L 27/00
USPC .......... 333/236, 238, 245, 246; 257/685, 686, 257/777
See application file for complete search history.

(56) References Cited

U.S. PATENT DOCUMENTS

| | | | | |
|---|---|---|---|---|
| 5,369,379 | A | * 11/1994 | Fujiki | .......................... 333/116 |
| 7,282,791 | B2 | * 10/2007 | Funaba et al. | ................. 257/685 |
| 7,911,066 | B2 | * 3/2011 | Ehlers et al. | ................... 257/778 |
| 8,134,228 | B2 | * 3/2012 | Komatsu et al. | .............. 257/686 |
| 2006/0006516 | A1 | 1/2006 | Funaba et al. | |
| 2007/0267758 | A1 | 11/2007 | Tao et al. | |
| 2008/0128916 | A1 | 6/2008 | Soejima et al. | |
| 2009/0079523 | A1 | 3/2009 | Hsu | |

FOREIGN PATENT DOCUMENTS

EP        0205570 A1    12/1986

OTHER PUBLICATIONS

French Search Report dated Jul. 20, 2011 from corresponding French Application No. 10/58826.
Gardiol F.E., *Design and Layout of Microstrip Structures*, IEEE Proceedings H. Microwaves, Antennas & Propagation , Institution of Electrical Engineers, Stevenage, GB, vol. 135, No. 3, Part H, Jun. 1, 1988, pp. 145-157, XP000006243.

* cited by examiner

*Primary Examiner* — Dean Takaoka
(74) *Attorney, Agent, or Firm* — Seed IP Law Group PLLC

(57) ABSTRACT

A transmission line formed in a device including a stack of first and second chips having their front surfaces facing each other and wherein a layer of a filling material separates the front surface of the first chip from the front surface of the second chip, this line including: a conductive strip formed on the front surface side of the first chip in at least one metallization level of the first chip; and a ground plane made of a conductive material formed in at least one metallization level of the second chip.

22 Claims, 2 Drawing Sheets

TRANSMISSION LINE FOR ELECTRONIC CIRCUITS

CROSS REFERENCE TO RELATED APPLICATIONS

This application claims the priority benefit of French patent application number 10/58826 filed on Oct.27, 2010, entitled TRANSMISSION LINE FOR ELECTRONIC CIRCUITS, which is hereby incorporated by reference to the maximum extent allowable by law.

BACKGROUND OF THE INVENTION

1. Field of the Invention

The present invention relates to a line for transmitting a high-frequency signal in an electronic device.

2. Discussion of the Related Art

The transmission of a signal of high frequency, typically greater than 300 MHz, from one point to another of an electronic device, for example, from one point to another of an integrated circuit chip, requires the use of specific propagation lines, or waveguides. Two types of transmission lines are mainly used, microstrips and coplanar lines.

A microstrip comprises a conductive track superposed to a ground plane made of a conductive material and separated therefrom by a dielectric layer.

A coplanar line comprises, in the same plane, a conductive track surrounded with two conductive ground planes and separated therefrom by a dielectric material. Transmission lines of microstrip type are more specifically considered herein.

FIG. 1 is a cross-section view schematically showing a microstrip formed in the upper portion of a semiconductor chip 1 (the cross-sectional plane is orthogonal to the signal propagation direction).

Chip 1 is formed inside and on top of a semiconductor substrate 3, for example a silicon substrate. The upper surface of substrate 3 is coated with a stack 5 of metallic and insulating layers, where various chip component interconnects (not shown in the drawing) may especially be formed. In this example, stack 5 comprises six different metallization levels M1 to M6, M1 and M6 respectively being the level closest to the substrate (lower level) and the level most remote from the substrate (upper level). The insulating layers of the stack are, for example, made of silicon oxide.

The shown transmission line comprises a ground plane 7, formed in lower metallization level M1. As a variation, ground plane 7 may also be formed in several lower metallization levels, for example, levels M1 and M2.

The transmission line further comprises, above the ground plane, a conductive track or strip 8 of width W smaller than the width of ground plane 7. Strip 8 is formed in upper metallization level M6. No intermediary metallization is formed between ground plane 7 and strip 8, so that strip 8 is only separated from ground plane 7 by a dielectric layer 9 of thickness e, where e is the distance between levels M2 and M6.

When a high-frequency signal is applied on conductive strip 8, it propagates in the transmission line.

Characteristic impedance $Z_C$ of the line should be specifically matched to the impedance of the components connected to the input and to the line output. A poorly matched impedance would cause losses by reflection of the signal on the load impedance.

Considering a line with no loss, characteristic impedance $Z_C$ of the line especially depends on capacitance C formed between strip 8 and ground plane 7, and on inductance L formed by strip 8, according to relation $Z_C = \sqrt{L/C}$.

In practice, linear attenuation coefficient a of the line is defined by relation $\alpha = R/(2*Z_C)$, where R designates the resistance per unit length of the line.

Thus, to minimize the linear attenuation of the line, one should both limit the resistive loss and maintain a high characteristic impedance.

In practice, for a given manufacturing technology, the thicknesses of the conductive and insulating materials of stack 5 are difficult to modify. Thus, only the selection of width W of strip 8 and of the metallization levels used to form strip 8 and ground plane 7 enable to optimize impedance $Z_C$. The selection of the metallization levels especially determines thickness e of dielectric layer 9, which conditions capacitance C.

Width W of strip 8 is generally desired to be as high as possible to limit the resistive loss introduced by the line. This, however, results in increasing capacitance C and thus in decreasing impedance $Z_C$ of the line. For an aimed impedance $Z_C$, to have as wide a strip 8 as possible, it is generally chosen, as illustrated in FIG. 1, to form strip 8 and ground plane 7 in the end metallization levels of the chip (respectively in the most remote level(s) and in the closest level(s) with respect to the substrate). This enables to maximize thickness e of dielectric layer 9, to decrease capacitance C, and thus to maintain a relatively high characteristic impedance.

The attenuation introduced by the line however remains significant. In silicon technology, to form integrated circuits capable of processing signals of millimetric wavelengths, the maximum available thickness between the end metallization levels of the chip (strip 8 and ground plane 7) can reach 10 μm. To reach a 50-ohm impedance $Z_C$, width W of strip 8 must be smaller than 10 μm. This results in a strong attenuation of the signal running through the line, for example, a 0.5-dB/mm attenuation at 60 GHz. This attenuation is mainly due to the resistive loss increased by the narrowness of strip 8.

It would be desirable to have high-frequency transmission lines having a lower linear attenuation.

The transmission of high-frequency signals in chip stacking devices is more specifically considered herein.

SUMMARY OF THE INVENTION

An embodiment provides a transmission line in a chip stacking device, which overcomes at least some of the disadvantages of existing solutions.

An embodiment provides such a line which only slightly attenuates the signal running through the line, as compared with existing solutions.

Thus, an embodiment provides a transmission line formed in a device comprising a stack of first and second chips having their front surfaces facing each other and wherein a layer of a filling material separates the front surface of the first chip from the front surface of the second chip, this line comprising: a conductive strip formed on the front surface side of the first chip in at least one metallization level of the first chip; and a ground plane made of a conductive material formed on the front surface side of the second chip in at least one metallization level of the second chip.

According to an embodiment, the first chip comprises a substrate of high resistivity.

According to an embodiment, the first and second chips are interconnected by conductive pillars extending from the front surface of at least one of the chips.

According to an embodiment, the thickness of said layer of a filling material ranges between 20 and 100 μm.

According to an embodiment, the strip is formed in at least one upper metallization level of the first chip.

According to an embodiment, the ground plane is formed in at least one lower metallization level of the second chip.

According to an embodiment, the resistivity of the substrate of the first chip is greater than 300 ohms.cm.

According to an embodiment, the filling material has a relative dielectric constant smaller than 4.

BRIEF DESCRIPTION OF THE DRAWINGS

The foregoing and other objects, features, and advantages will be discussed in detail in the following non-limiting description of specific embodiments in connection with the accompanying drawings.

DETAILED DESCRIPTION

Figure 1:
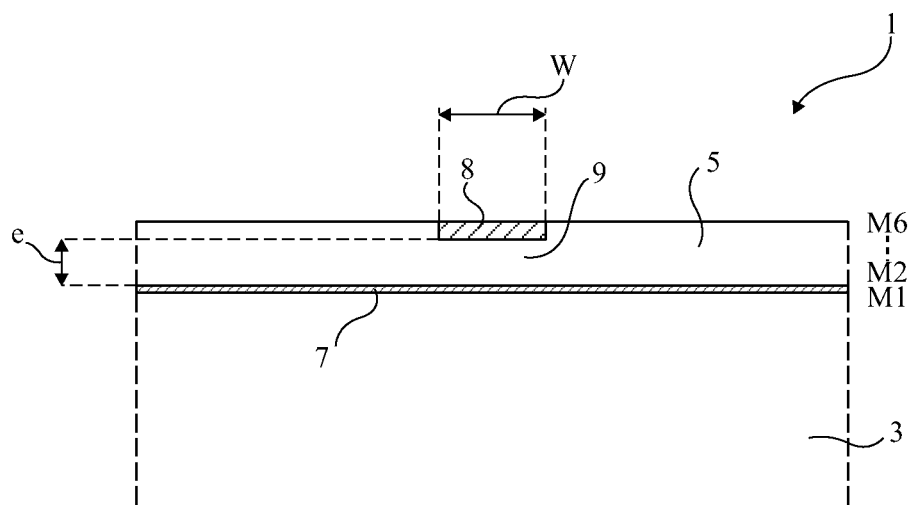
FIG. 1, previously described, is a cross-section view schematically showing a microstrip formed on a semiconductor substrate.

For clarity, the same elements have been designated with the same reference numerals in the different drawings and, further, as usual in the representation of integrated circuits, the various drawings are not to scale.

In many miniaturized electronic devices, for example, cell phones, chip stacking techniques, also called 3-D integration techniques, are used. Chips that may have been thinned down are stacked and interconnected in several ways, to increase the available features without increasing the occupied surface area.

As an example, in a currently encountered configuration, first and second chips are appended on their respective front surfaces. Here and in the rest of the present description, the "front surface" of a chip will be the chip surface on the side of which the various metallization levels of the chip are formed (M1 to M6 in the example of FIG. 1). Conductive pillars, for example made of copper, extend vertically from the front surface of at least one of the chips. On assembly, these pillars are welded to corresponding pillars or to corresponding metal areas of the other chip. Other connection devices may be provided between the two chips, for example, conductive bumps. To ensure a good mechanical strength of the stack, a filling material is generally provided between the two chips. This material is, for example, injected, after assembly, to fill in the space separating the two chips by capillarity. The thickness of filling material provided between the two chips depends on the height of the pillars or interconnection bumps. As an example, this thickness may range from 20 to 100 μm. The filling material generally has a rather small relative dielectric constant, for example, smaller than 4, and may have low dielectric losses, typically on the order of $5*10^{-3}$.

It is here provided to form a transmission line in a device comprising first and second chips placed together with their front surfaces facing each other. This line comprises a conductive strip formed in at least one metallization level of the first chip and, in front of the conductive strip, a conductive ground plane formed in at least one metallization level of the second chip.

An advantage of such a line is that the dielectric thickness between the conductive strip and the ground plane can be much larger than in a microstrip of the type described in relation with FIG. 1. This enables, for a given line impedance, to provide a much larger conductive strip than in usual lines, and thus to decrease the linear attenuation coefficient of the line. It should be noted that the electric connection devices used to connect the two chips, for example, pillars or connection bumps, have a negligible attenuation coefficient at high frequency.

Figure 2:
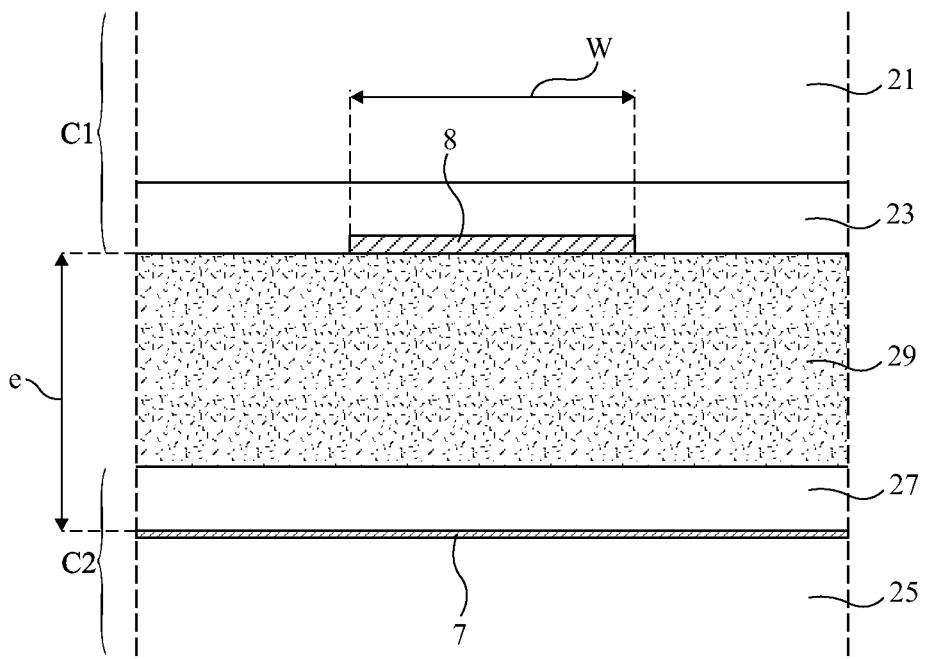
FIG. 2 is a cross-section view schematically showing an embodiment of a transmission line in a chip stacking device.

FIG. 2 is a cross-section view schematically showing an embodiment of a transmission line in a chip stacking device (the cross-sectional plane is orthogonal to the main direction of the line). The shown device comprises chips C1 and C2 stacked with their respective front surfaces facing each other. Chip C1 is formed inside and on top of a substrate 21, and comprises, on its front surface side, a stack 23 of metallic and insulating interconnection layers. Chip C2 is formed inside and on top of a substrate 25, and comprises, on its front surface side, a stack 27 of metallic and insulating interconnection layers. A filling material 29 separates the front surface of chip C1 from the front surface of chip C2.

A ground plane 7 is formed in the metallization levels of chip C2 (here, the lower level) and, on top of ground plane 7, a conductive strip 8 of width W smaller than the width of ground plane 7 is formed in the metallization levels of chip C1 (here, the upper level).

Thickness e of dielectric material which separates ground plane 7 from strip 8 is equal to the sum of the thicknesses of the dielectric separating ground plane 7 from the front surface of chip C2, of filling layer 29, and of the dielectric separating strip 8 from the front surface of chip C1.

In an embodiment, thickness e is approximately 40 μm. To obtain a line impedance $Z_C$=50 ohms, a strip 8 having a width W=40 μm is formed. This results in an attenuation smaller than 0.25 dB/mm for a 60-GHz signal (to be compared with 0.5 dB/mm in the case of a microstrip of the type described in relation with FIG. 1).

Ground plane 7 shields the transmission line from substrate 25 of chip C2. Thus, the resistivity of substrate 25 has no influence on the electric performance of the line. To reduce the effect of the resistivity of substrate 21 of chip C1, a chip C1 formed inside and/or on top of a substrate 21 of high resistivity, for example, a substrate having a resistivity greater than 300 ohms.cm, may be used.

Figure 3A:
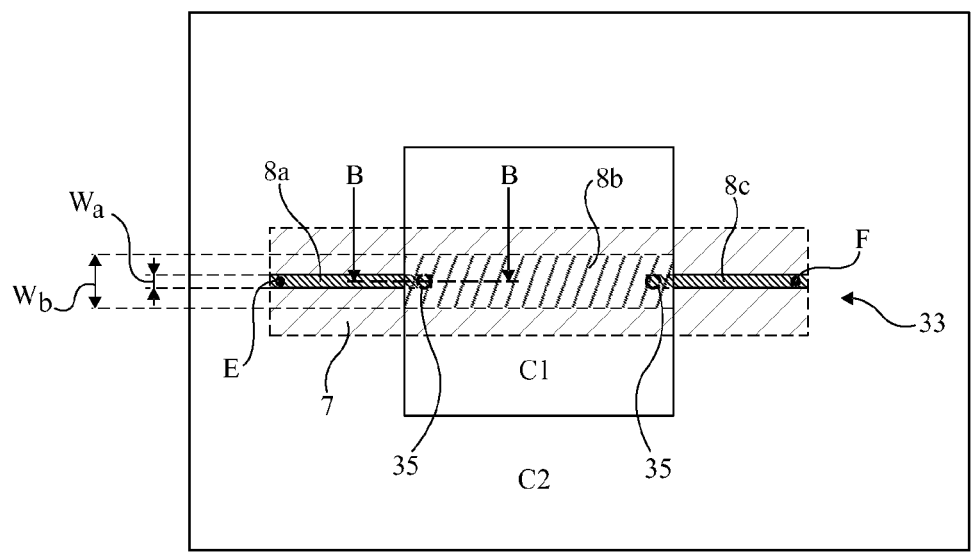
FIG. 3A is a top view of a chip stacking device, very schematically illustrating an embodiment of a connection between a microstrip and a transmission line of the type described in relation with FIG. 2.

FIG. 3A is a top view of a chip stacking device, very schematically illustrating an embodiment of a connection between a microstrip of the type described in relation with FIG. 1 and a transmission line of the type described in relation with FIG. 2.

Figure 3B:
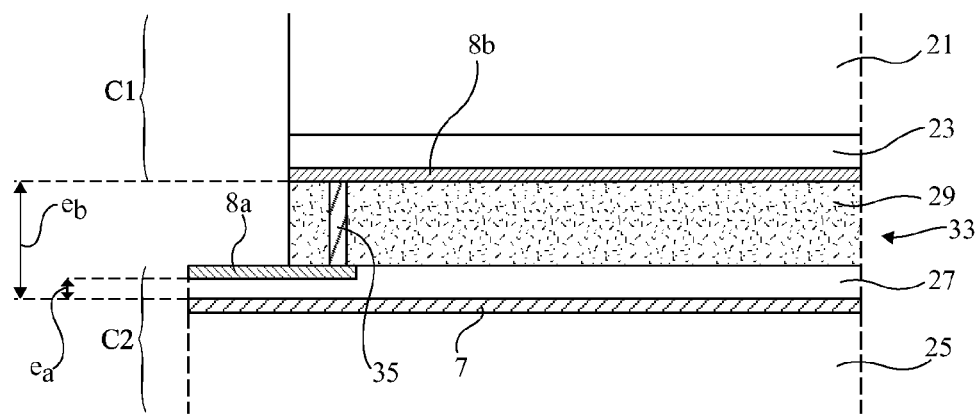
FIG. 3B is a partial cross-section view of the device of FIG. 3A, along axis B-B.

FIG. 3B is a partial cross-section view of the device of FIG. 3A along axis B-B.

The device of FIGS. 3A and 3B comprises chips C1 and C2 stacked by their respective front surfaces. Chip C1 is for example formed from a substrate of high resistivity. In the shown example, it takes up a smaller surface area than chip C2, but the present invention is not limited to this specific case. In this example, chip C1 is arranged, in top view, in front of a central portion of chip C2. A filling material 29 (FIG. 3B) is placed between chips C1 and C2.

A line 33 for transmitting a high-frequency signal between points E and F of chip C2 is considered. Points E and F are arranged, in top view, on either side of chip C1, and line 33 follows the shortest way between points E and F, that is, through chip C1 (in top view).

Line 33 comprises a ground plane 7 formed in one or several lower metallization levels of chip C2, extending between point E and point F.

On a first section of line 33, between point E and the edge of chip C1 closest to point E, a conductive strip 8a, on top of ground plane 7, is formed in at least one upper metallization level of chip C2. A small part of strip 8a extends under chip C1. Strip 8a is separated from ground plane 7 by a dielectric thickness $e_a$ (FIG. 3B), and has a width $W_a$ much smaller than the width of ground plane 7.

On a second section of line 33, between the edge of chip C1 closest to point E and the edge of chip C1 closest to point F, a conductive strip 8b, on top of ground plane 7, is formed in at least one metallization level of chip C1 (here, an upper level). Strip 8b is separated from ground plane 7 by a dielectric thickness $e_b$ (FIG. 3B) much greater than thickness $e_a$. Since the first and second sections have a same impedance, width $W_b$ of strip 8b is much greater than width $W_a$ of strip 8a.

A copper pillar 35, crossing filling material 32, connects strip 8a to strip 8b at the level where strip 8a is covered by strip 8b.

On a third section of line 33, between the edge of chip C1 closest to point F and point F, a conductive strip 8c, on top of ground plane 7, is formed in at least one upper metallization level of chip C2. A small part of strip 8c extends under chip C1. In this example, strip 8c is separated from ground plane 7 by the same dielectric thickness $e_a$ as track 8a, and has the same width $W_a$ as track 8a. Strip 8c is connected to strip 8b by a copper pillar 35 (FIG. 3A).

An advantage of transmission lines of the type described in relation with FIGS. 2 to 3B is that the dielectric thickness between the conductive strip and the ground plane may be much greater than in a microstrip of the type described in relation with FIG. 1, which enables, for a given line impedance, to provide a conductive strip much wider than in usual lines, and thus to decrease the linear attenuation coefficient of the line.

Another advantage of such a transmission line is that it can be easily formed by using usual steps of chip stacking device manufacturing. It should especially be noted that the alignment accuracy of current machines for assembling chip stacking devices is more than sufficient to properly align the conductive strip and the ground plane of the transmission line with respect to each other.

Of course, the present invention is not limited to this specific case. More generally, it will be within the abilities of those skilled in the art to adapt the provided transmission line structure to other types of chip stacking devices and to other line patterns. For example, it will be within the abilities of those skilled in the art to connect a transmission line of the provided type to any other known transmission line type, for example, to a coplanar line, and/or to any adapted electronic device.

Specific embodiments of the present invention have been described. Various alterations, modifications and improvements will readily occur to those skilled in the art.

In particular, the present invention is not limited to the specific example of chip assembly described in relation with FIG. 2, in which conductive pillars connect the chips, and in which a dielectric filling material is injected between the pillars after assembly. It will be within the abilities of those skilled in the art to adapt the provided solution to other chip assembly modes. In particular, the conductive pillars may be replaced with contact bumps or with any other adapted chip interconnection system.

Further, the present invention is not limited to the examples of numerical values mentioned as an example in the present description.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A transmission line formed in a device comprising:
a stack of first and second chips having their front surfaces facing each other and wherein a layer of a filling material separates the front surface of the first chip from the front surface of the second chip, the transmission line comprising:
a conductive strip formed on the front surface side of the first chip in at least one metallization level of the first chip; and
a ground plane of a conductive material formed on the front surface side of the second chip in at least one metallization level of the second chip, wherein one or both of the first and second chips comprise a semiconductor substrate and a plurality of metallization levels formed on the semiconductor substrate, the metallization levels including chip component interconnects.

2. The line of claim 1, wherein the first chip comprises a substrate of high resistivity.

3. The line of claim 1, wherein the first and second chips are interconnected by conductive pillars extending from the front surface of at least one of the chips.

4. The line of claim 1, wherein the thickness of said layer of a filling material ranges between 20 and 100 μm.

5. The line of claim 1, wherein the strip is formed in at least one upper metallization level of the first chip.

6. The line of claim 1, wherein the ground plane is formed in at least one lower metallization level of the second chip.

7. The line of claim 2, wherein the resistivity of the substrate of the first chip is greater than 300 ohms.cm.

8. The line of claim 1, wherein said filling material has a relative dielectric constant smaller than 4.

9. A transmission line comprising:
a conductive strip formed in a metallization layer on a first chip;
a ground plane of conductive material formed in a metallization layer on a second chip; and
a filling material between front surfaces of the first and second chips, wherein the conductive strip and the ground plane form a transmission line and wherein one or both of the first and second chips comprise a semiconductor substrate and a plurality of metallization layers formed on the semiconductor substrate, the metallization layers including chip component interconnects.

10. A transmission line as defined in claim 9, further comprising conductive pillars interconnecting the first and second chips.

11. A transmission line as defined in claim 9, wherein the conductive strip is formed in at least one upper metallization level of the first chip.

12. A transmission line as defined in claim 9, wherein the ground plane is formed in at least one lower metallization layer of the second chip.

13. A transmission line as defined in claim 9, further comprising a conductive strip formed in a metallization layer of the second chip and a conductive pillar connecting the conductive strip in the first chip and the conductive strip in the second chip.

14. An electronic device comprising:
- a first chip having a conductive strip formed in at least one metallization layer of the first chip;
- a second chip having a ground plane of conductive material formed in at least one metallization layer of the second chip; and
- a filling material between front surfaces of the first and second chips, wherein the first and second chips form a stack, wherein the conductive strip and the ground plane form a transmission line and wherein one or both of the first and second chips comprise a semiconductor substrate and a plurality of metallization layers formed on the semiconductor substrate, the metallization layers including chip component interconnects.

15. An electronic device as defined in claim 14, further comprising a conductive strip formed in a metallization layer of the second chip and a conductive pillar connecting the conductive strip in the first chip and the conductive strip in the second chip.

16. An electronic device as defined in claim 14, further comprising conductive pillars interconnecting the first and second chips.

17. An electronic device as defined in claim 14, wherein the conductive strip is formed in at least one upper metallization level of the first chip.

18. An electronic device as defined in claim 14, wherein the ground plane is formed in at least one lower metallization layer of the second chip.

19. A method for making an electronic device, comprising:
- forming a conductive strip in a metallization layer of a first chip;
- forming a ground plane of conductive material in a metallization layer of a second chip; and
- stacking the first and second chips with their front surfaces facing each other and a filling material between the front surfaces of the first and second chips, wherein the conductive strip and the ground plane form a transmission line and wherein one or both of the first and second chips comprise a semiconductor substrate and a plurality of metallization layers formed on the semiconductor substrate, the metallization layers including chip component interconnects.

20. A method for making an electronic device as defined in claim 19, further comprising forming conductive pillars between the first and second chips.

21. A method for making an electronic device as defined in claim 19, wherein the conductive strip is formed in an upper metallization level of the first chip and the ground plane is formed in a lower metallization level of the second chip.

22. A method for making an electronic device as defined in claim 19, further comprising forming a conductive strip in a metallization layer of the second chip and forming a conductive pillar interconnecting the conductive strip in the first chip and the conductive strip in the second chip.

* * * * *